US010006957B2

(12) United States Patent
Shang et al.

(10) Patent No.: US 10,006,957 B2
(45) Date of Patent: Jun. 26, 2018

(54) CIRCUIT AND METHOD FOR TESTING TRANSISTOR(S)

(71) Applicant: BOE TECHNOLOGY GROUP CO., LTD., Beijing (CN)

(72) Inventors: Guangliang Shang, Beijing (CN); Yun Sik Im, Beijing (CN); Seung Woo Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 286 days.

(21) Appl. No.: 14/573,100

(22) Filed: Dec. 17, 2014

(65) Prior Publication Data

US 2016/0109504 A1 Apr. 21, 2016

(30) Foreign Application Priority Data

Oct. 21, 2014 (CN) ...................... 2014 1 0563203 A

(51) Int. Cl.
*G01R 31/26* (2014.01)
*H01L 21/66* (2006.01)

(52) U.S. Cl.
CPC ..... *G01R 31/2621* (2013.01); *G01R 31/2608* (2013.01); *H01L 22/34* (2013.01)

(58) Field of Classification Search
CPC .............. G09G 3/006; G01R 31/2884; G01R 31/2621; G01R 31/27; G01R 31/2608; G01R 31/26; H01L 22/30; H01L 22/3234
USPC ....................... 324/762.01–762.1; 438/14–18
See application file for complete search history.

(56) References Cited

U.S. PATENT DOCUMENTS

| 5,561,373 | A | * | 10/1996 | Itoh | .......................... | H01L 22/14 |
| | | | | | | 257/E21.531 |
| 2004/0148123 | A1 | | 7/2004 | Abe | | |
| 2005/0156605 | A1 | * | 7/2005 | Lee | .......................... | G11C 29/50 |
| | | | | | | 324/537 |
| 2005/0278677 | A1 | * | 12/2005 | Ang | ................... | G01R 31/2628 |
| | | | | | | 438/18 |
| 2007/0285104 | A1 | * | 12/2007 | Cano | ................. | G01R 31/31723 |
| | | | | | | 324/537 |

(Continued)

FOREIGN PATENT DOCUMENTS

| CN | 200976035 Y | 11/2007 |
| CN | 101136347 A | 3/2008 |

(Continued)

OTHER PUBLICATIONS

First Chinese Office Action dated Jul. 8, 2016: Appln. No. 201410563203.1.

(Continued)

*Primary Examiner* — Tung X Nguyen
*Assistant Examiner* — Lee Rodak
(74) *Attorney, Agent, or Firm* — Ladas & Parry LLP

(57) ABSTRACT

A circuit and method for testing transistor(s) are provided. The circuit is used for testing a set of transistors including at least two transistors, and the circuit includes: a first power supply voltage terminal connected to first electrodes of the respective transistors; a first control signal terminal connected to control electrodes of the respective transistors; and a set of test terminals including at least two test terminals; the test terminals are connected to second electrodes of the corresponding transistors, respectively.

16 Claims, 5 Drawing Sheets

(56) References Cited

U.S. PATENT DOCUMENTS

| | | | |
|---|---|---|---|
| 2010/0318313 A1* | 12/2010 | Agarwal | G01R 31/31851 702/117 |
| 2011/0318851 A1* | 12/2011 | Godo | G01R 31/2625 438/17 |
| 2013/0069682 A1* | 3/2013 | Tso | H01L 22/34 324/755.01 |
| 2013/0076388 A1* | 3/2013 | Hou | G01R 31/2884 324/762.09 |
| 2014/0152338 A1* | 6/2014 | Lee | G01R 31/2608 324/762.07 |
| 2015/0042372 A1* | 2/2015 | Pan | G01R 31/2607 324/762.01 |
| 2015/0177309 A1* | 6/2015 | Lee | G01R 31/2621 324/750.01 |
| 2016/0109505 A1* | 4/2016 | Capodivacca | G01R 31/2621 324/762.09 |

FOREIGN PATENT DOCUMENTS

| | | |
|---|---|---|
| CN | 101629979 A | 1/2010 |
| CN | 103064000 A | 4/2013 |
| CN | 103345914 A | 10/2013 |
| CN | 203705600 U | 7/2014 |
| JP | 6425070 A | 1/1989 |

OTHER PUBLICATIONS

Second Chinese Office Action dated Dec. 17, 2016: Appln. No. 201410563203.1.

* cited by examiner

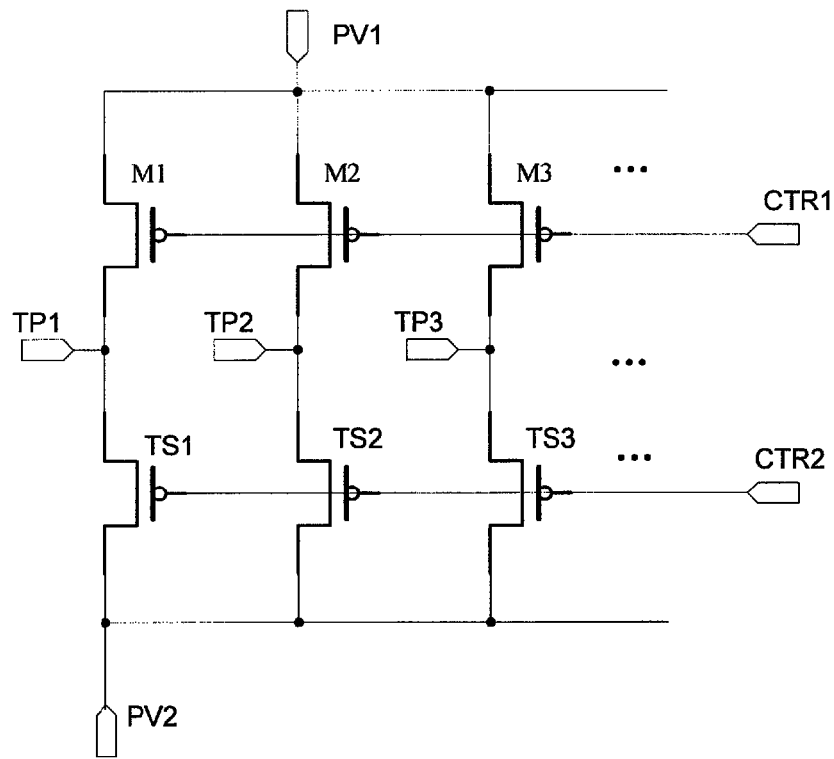

Fig. 7

| the drains of the respective transistors are connected to the first power supply voltage terminal PV1, the gates of the respective transistors are connected to the first control signal terminal CTR1, and the sources of the respective transistors are connected to the corresponding test terminals TPs, respectively |
|---|
| the first voltage V1 is applied to the first power supply voltage terminal PV1, and the first control signal Vg is applied to the first control signal terminal CTR1, and the test voltage is applied or is not applied to the test terminal TP depending on the test requirements |

Fig. 8 the respective test terminals are connected to the second power supply voltage terminal via the selection switch unit; wherein the selection switch unit comprises the plurality of selection switches; wherein the first terminals of the respective selection switches are connected to the second power supply voltage terminal; the control terminals of the respective selection switches are connected to the second control signal terminal; and the second terminals of the selection switches are connected to the corresponding test terminals, respectively the first voltage V1 is applied to the first power supply voltage terminal PV1, the first control signal Vg is applied to the first control signal terminal CTR1, the test terminal to which the transistor to be tested is connected is supplied with the test voltage or is floated; the second control signal is applied to the second control signal terminal, and the second power supply voltage terminal is supplied with the second voltage or is floated

Fig. 9

CIRCUIT AND METHOD FOR TESTING TRANSISTOR(S)

TECHNICAL FIELD

The present disclosure relates to the art of testing transistors, and particularly to a circuit and method for testing transistor(s).

BACKGROUND

Various transistors, as commonly-used devices in an electrical field, are applied widely. For products manufactured in mass in an electronic industry, such as various Thin Film Transistors (TFTs), Metal Oxide Semiconductor (MOS) transistors and the like which are widely used in a liquid crystal field at present, their various electrical characteristics are required being tested, in order to ensure performances required and a reliable quality as applied to an electronic apparatus. Currently, when a transistor is tested, generally a bias voltage characteristic of each single transistor is tested one-by-one and then a current of each transistor is tested. By taking a MOS transistor as an example, the bias state of the MOS transistor should be tested in some bias conditions generally, for example, in a case where a voltage of an electrode of the MOS transistor is fixed while voltages of the other two electrodes are changed. since the time taken for testing each transistor is long and a number of the transistors to be tested is large, a testing efficiency is very low, which greatly decreases efficiencies of the subsequent work flows. FIG. 1 illustrates a connection for a known circuit for testing transistor(s), wherein, by taking a NMOS transistor as an example, a drain of the NMOS transistor is connected to a power supply voltage Vd, its gate is connected to a gate control signal Vg, and its source is connected to a test terminal; depending on testing requirements, the voltages applied to the respective electrodes are changed so at to test the bias state of the NMOS transistor. Since only one transistor can be tested regarding its bias state each time, the testing efficiency is very low. Similarly, when bias voltage characteristics of transistors are tested, in general, the transistors are tested respectively. By taking the NMOS transistor as an example, the drain of the NMOS transistor is connected to the power supply voltage Vd, its gate is connected to the gate control Vg, and its source is in a floating state, wherein the voltages applied to the corresponding electrodes are changed depending on the test requirements, so that the bias voltage state in which its source is in a floating state can be tested. Since only one transistor can be tested regarding its bias voltage state each time, the testing efficiency is very low.

SUMMARY

In view of this, the present disclosure provides a circuit and method for testing transistor(s), which can test bias voltage characteristics of a plurality of transistors simultaneously.

In particular, according to an aspect of the present disclosure, there is provided a circuit for testing a set of transistors including at least two transistors, the circuit comprises: a first power supply voltage terminal connected to first electrodes of the respective transistors; a first control signal terminal connected to control electrodes of the respective transistors; and a set of test terminals including at least two test terminals, wherein the respective test terminals are connected to second electrodes of the transistors, respectively.

Optionally, in the above circuit, when the bias voltage characteristics of the respective transistors are tested simultaneously, the first power supply terminal is configured to supply the first electrodes of the respective transistors with a first voltage, the first control signal terminal is configured to supply the control electrodes of the respective transistors with a first control signal, and the respective test terminals are configured to be in a floating state.

Optionally, in the circuit, when current characteristics of the corresponding transistors are tested respectively, the first power supply voltage terminal is configured to supply the first electrodes of the respective transistors with the first voltage, the first control signal terminal is configured to supply the control electrodes of the respective transistors with the first control signal, and the test terminal to which the transistor to be tested is connected is configured to receive a test voltage, while other test terminals are configured to be in the floating state.

Further, according to another solution proposed in the present disclosure, by controlling a set of transistors including a plurality of transistors and a selection switch unit, it can be achieved that the bias voltages are applied to the plurality of transistors to be tested simultaneously, and that then current characteristics of the corresponding transistors are tested respectively after the bias voltages are applied, which avoids applying the bias voltage to the plurality of transistor to be tested one by one, thus reducing the time consumed in test and improving the testing efficiency.

Particularly, the above circuit can further comprise: a selection switch unit comprising at least two selection switches; a second power supply voltage terminal connected to first terminals of the respective selection switches; a second control signal terminal connected to control terminals of the respective selection switches; wherein second terminals of the respective selection switches are connected to the corresponding test terminals, respectively.

Optionally, in the circuit, the respective selection switches are switching transistors, the control terminal of each of the selection switches is the gate of the switching transistor, the first terminal thereof is are one of the source and drain of the switching transistor, and the second terminal thereof is the other of the source and drain of the switching transistor.

Optionally, in the circuit, when the bias voltage characteristics of the respective transistors are tested simultaneously, the first power supply terminal is configured to supply the first electrodes of the respective transistors with the first voltage; the second power supply voltage terminal is configured to supply the first terminal of the respective selection switches with a second voltage or not; the first control signal terminal is configured to supply the control electrodes of the respective transistors with the first control signal; the second control signal terminal is configured to supply the respective selection switches with a second control signal so as to turn on the respective selection switches, so that the second electrodes of the respective transistors are connected to the second power supply voltage terminal; and the respective test terminals are configured to be in the floating state.

Optionally, in the above circuit, a level of the first control signal applied as a positive bias test is performed on the respective transistors and that applied as a reverse bias test is performed on the respective transistors are opposite.

Optionally, in the circuit, when the current characteristics of the corresponding transistors are tested respectively, the first power supply voltage terminal is configured to supply the first electrodes of the respective transistors with the first voltage; the second power supply voltage terminal is configured to supply the first terminals of the respective selection switches with the second voltage or not; the first control signal terminal is configured to supply the control electrodes of the respective transistors with the first control signal; the second control signal terminal is configured to supply the respective selection switches with a second control signal so as to turn off the respective selection switches, so that the second electrodes of the respective transistors are disconnected from the second power supply voltage terminal; and the test terminal to which the corresponding transistor to be tested is connected is configured to provide the test voltage, while other test terminals are configured to be floated.

Optionally, in the above circuit, levels of the first voltage and the second voltage are different, and the first voltage, the test voltage and/or the first control signal are configured to change their level amplitudes with time depending on test requirements.

Optionally, in the above circuit, the levels of the second voltage and the test voltage are configured to be same.

According to another aspect of the present disclosure, there is provided a method for testing a set of transistors including at least two transistors, wherein the method comprises: connecting first electrodes of the respective transistors to a first power supply voltage terminal; connecting control electrodes of the respective transistors to a first control signal terminal; and connecting second electrodes of the transistors to corresponding test terminals, respectively, wherein a first voltage is supplied to the first electrodes of the respective transistors via the first power supply voltage terminal, and a first control signal is supplied to the control electrodes of the respective transistors via the first control signal terminal.

Optionally, the above method can further comprise, when bias voltage characteristics of the respective transistors are tested simultaneously, setting the respective test terminals to be in a floating state, and changing levels of the first voltage and/or the first control signal depending on test requirements.

Optionally, the method can further comprise, when current characteristics of the corresponding transistors are tested respectively, supplying the test terminal to which the corresponding transistor to be tested is connected with a test voltage while setting other test terminals to be in the floating state, and changing the levels of the first voltage, the test voltage and/or the first control signal depending on the test requirements.

According to the embodiments of the present disclosure, by controlling a set of transistors including the plurality of transistors to be tested, it can be achieved that the bias voltage characteristics for the plurality of transistors are tested simultaneously, and that current characteristics of the corresponding transistors can be further tested respectively, which avoids testing the bias voltage characteristics of the plurality of transistors one by one, so that a waiting time is reduced and a testing efficiency is improved.

Optionally, the above method further comprises: connecting the second electrodes of the respective transistors to a second power supply voltage terminal via a selection switch unit, respectively; wherein the selection switch unit comprises at least two selection switches; wherein first terminals of the respective selection switches are connected to a second power supply voltage terminal; control terminals of the respective selection switches are connected to a second control signal terminal; and second terminals of the respective selection switches are connected to the corresponding test terminals, respectively; wherein a second voltage or no voltage is supplied to the first terminals of the respective selection switches via the second power supply voltage terminal; and a second control signal is supplied to the respective selection switches via the second control signal terminal, in order to turn on or turn off the corresponding selection switches.

Optionally, the circuit can further comprise, when the bias voltage characteristics of the respective transistors are tested simultaneously: supplying the respective selection switches with the second control signal via the second control signal terminal so as to turn on the respective selection switches, so that the second electrodes of the respective transistors are connected to the second power supply voltage terminal; and setting the respective test terminals to be in the floating state.

Optionally, in the above method, when the bias voltage characteristics of the plurality of transistors are tested simultaneously, the levels of the first voltage, the first control signal and/or the second voltage are changed depending on the test requirements.

Optionally, in the above method, the level of the first control signal applied as a positive bias test is performed on the respective transistors and that applied as a reverse bias test is performed on the respective transistors are opposite.

Optionally, in the method, when the current characteristics of the corresponding transistors are tested respectively, the second control signal is supplied to the respective selection switches via the second control signal terminal, in order to turn off the respective selection switches, so that the second electrodes of the respective transistors are disconnected from the second power supply voltage terminal; and the test voltage is supplied to the test terminal to which the corresponding transistor to be tested is connected, while the other test terminals are configured to be in the floating state.

Optionally, in the above method, when the current characteristics of the corresponding transistors are tested respectively, the levels of the first voltage, the test voltage and/or the first control signal are changed depending on the test requirements.

Further, according to the embodiments of the present disclosure, by controlling a set of transistors including a plurality of transistors and a selection switch unit, it can be achieved that the bias voltages are applied to the plurality of transistors simultaneously, and that then current characteristics of the corresponding transistors are tested respectively after the bias voltages are applied, which avoids applying the bias voltage to the plurality of transistor to be tested one by one, thus reducing the waiting time and improving the testing efficiency.

BRIEF DESCRIPTION OF THE DRAWINGS

In order to explain solutions in embodiments of the present disclosure or the prior art more clearly, drawings required as describing the embodiments of the present disclosure or the prior art will be introduced briefly below. Obviously, the drawings described below only illustrate some embodiments of the present disclosure, instead of making any limitation on the present disclosure. Wherein:

FIG. 7 is a view illustrating a connection structure of a further circuit for testing transistor(s) according to an embodiment of the present disclosure;

FIG. 8 is a flowchart of a method for testing transistor(s) according to an embodiment of the present disclosure; and FIG. 9 is a flowchart of another method for testing transistor(s) according to an embodiment of the present disclosure.

DETAILED DESCRIPTION

Thereafter, solutions of embodiments of the present disclosure will be described clearly and completely in connection with drawings of the embodiments of the present disclosure, but obviously the described embodiments are only some, but not all of the embodiments of the present disclosure. Any other embodiments obtained by those ordinary skilled in the art based on the embodiments of the present disclosure without inventive labors should fall into a scope sought for protection in the present disclosure.

Figure 1:
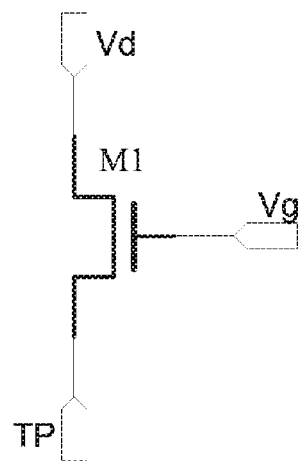
FIG. 1 illustrates a connection structure of a known circuit for testing transistor(s)
Figure 2:
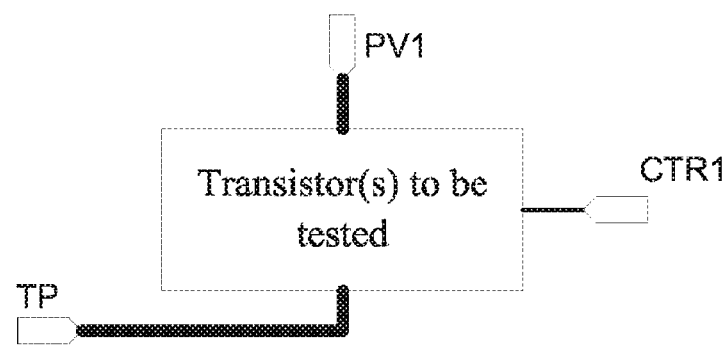
FIG. 2 is a block diagram illustrating a circuit for testing transistor(s) according to an embodiment of the present disclosure.

FIG. 2 is a block diagram of a circuit for testing transistor(s) according to an embodiment of the present disclosure, wherein a set of transistors including a plurality of transistors to be tested are connected among a first power supply voltage terminal PV1, a first control signal terminal CTR1 and a set of test terminals TP.

Figure 3:
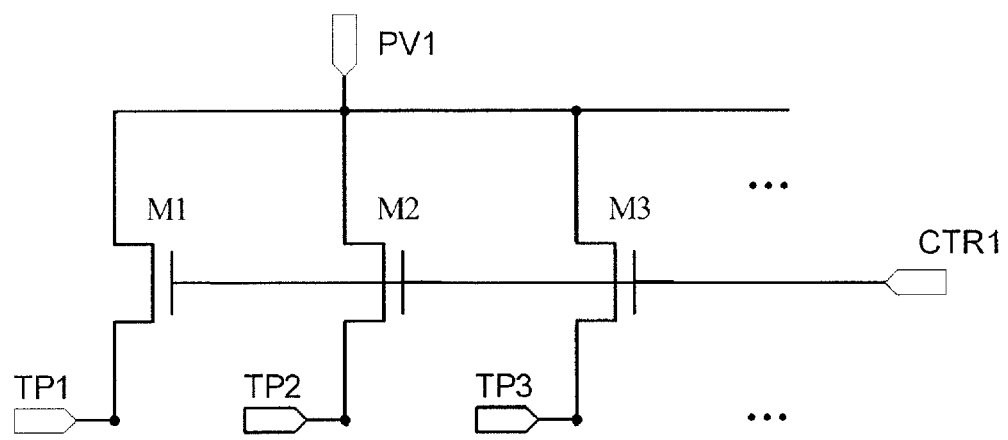
FIG. 3 is a view illustrating a connection structure corresponding to the circuit for testing transistor(s) shown in FIG. 2 according to an embodiment of the present disclosure.

Correspondingly, FIG. 3 is a view illustrating a connection structure corresponding to the circuit for testing transistor(s) shown in FIG. 2 according to an embodiment of the present disclosure. As illustrated in FIG. 3, the set of transistors comprises the plurality of transistors to be tested, M1, M2, M3, . . . , and the set of test terminals TP comprises a plurality of test terminals, TP1, TP2, TP3, . . . ; by making NMOS transistors as an example, drains of the transistors M1, M2, M3, . . . are connected to the first power supply voltage terminal PV1, their sources are connected to the plurality of test terminals TP1, TP2, TP3, . . . , respectively, and their gates are connected to the first control signal terminal CTR1, wherein the first power supply voltage terminal PV1 is connected with a power supply voltage V1 and the first control signal terminal CTR1 is connected with a first control signal Vg.

When bias voltage characteristics of the plurality of transistors are tested simultaneously, the test terminals to which the transistors to be tested are connected are floated. The power supply voltage V1 can be at a high level, and can also be varied depending on test requirements. The first control signal Vg can be at a high level, and can also be varied depending on the test requirements. Since the source of the transistor to be tested is floated, a bias voltage state of the transistor in this case can be obtained.

When current characteristics of the transistors are tested respectively, the test terminal (for example, TP3) to which the transistor to be tested (for example, the transistor M3) corresponds is connected to a testing voltage (for example, a ground level), and the test terminals to which the other transistors correspond to are floated. The power supply voltage V1 can be at a high level, and can also be varied depending on test requirements. The first control signal Vg can be at a high level, and can also be varied depending on the test requirements. A current flowing through the transistor to be tested (for example, M3) is detected by a probe, so that relationship between the current of the transistor to be tested and voltages of the corresponding drain, source and/or gate is obtained, thus the current characteristics is acquired.

Of course, when the current characteristic of the transistor is tested, the test terminal to which the transistor to be tested corresponds can also be connected to a test voltage (for example, a high level voltage), the power supply voltage V1 can also be at the ground level. The first control signal Vg is at a high level and can also be varied depending on the test requirements. The current flowing through the transistor to be tested is detected by a probe, so that the relationship between the current of the transistor to be tested and the voltages of the corresponding drain, source and/or gate is obtained, thus the current characteristics is acquired.

Figure 4:
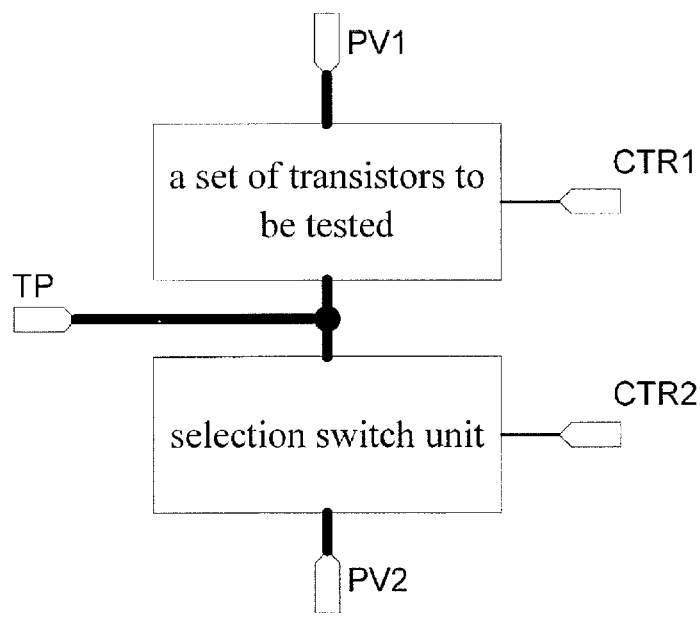
FIG. 4 is a block diagram illustrating another circuit for testing transistor(s) according to an embodiment of the present disclosure.

FIG. 4 illustrates a block diagram of another circuit for testing transistor(s) according to an embodiment of the present disclosure. As compared with the block diagram of the circuit for testing transistor(s) shown in FIG. 2, a main difference is in that a selection switch unit and a corresponding second control signal terminal CTR2 and a second power supply voltage terminal PV2 are added.

Figure 5:
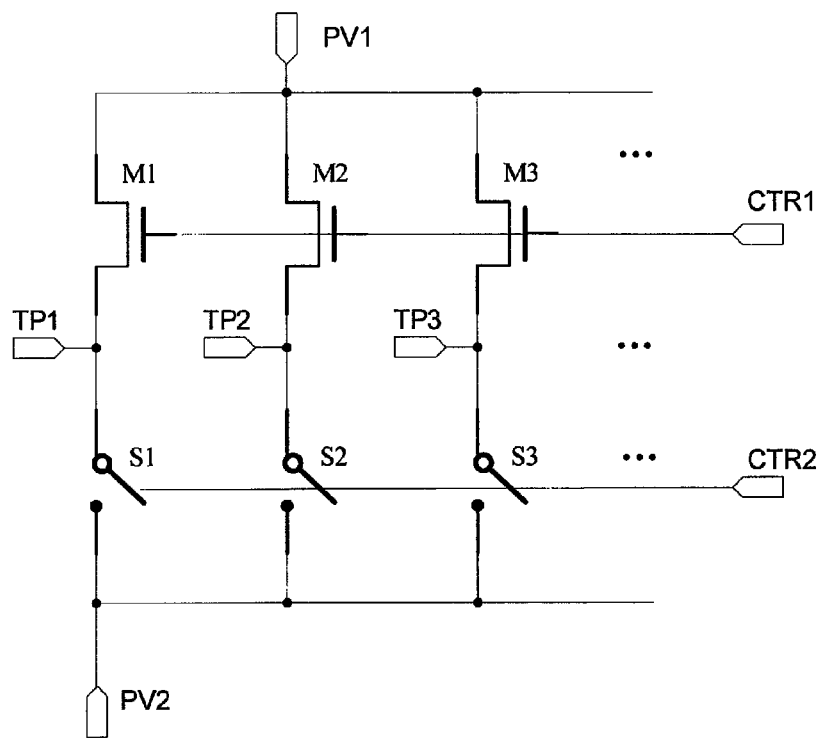
FIG. 5 is a view illustrating an exemplary connection structure corresponding to the circuit for testing transistor(s) shown in FIG. 4 according to an embodiment of the present disclosure.

In particular, as illustrated in FIG. 5, the selection switch unit comprises a plurality of selection switches S1, S2, S3, . . . , first terminals of the respective selection switches are connected to the second power supply voltage terminal PV2, second terminals of the respective selection switches are connected to the corresponding test terminals, respectively, and control terminals of the respective selection switches are connected to the second control signal terminal CTR2.

Figure 6:
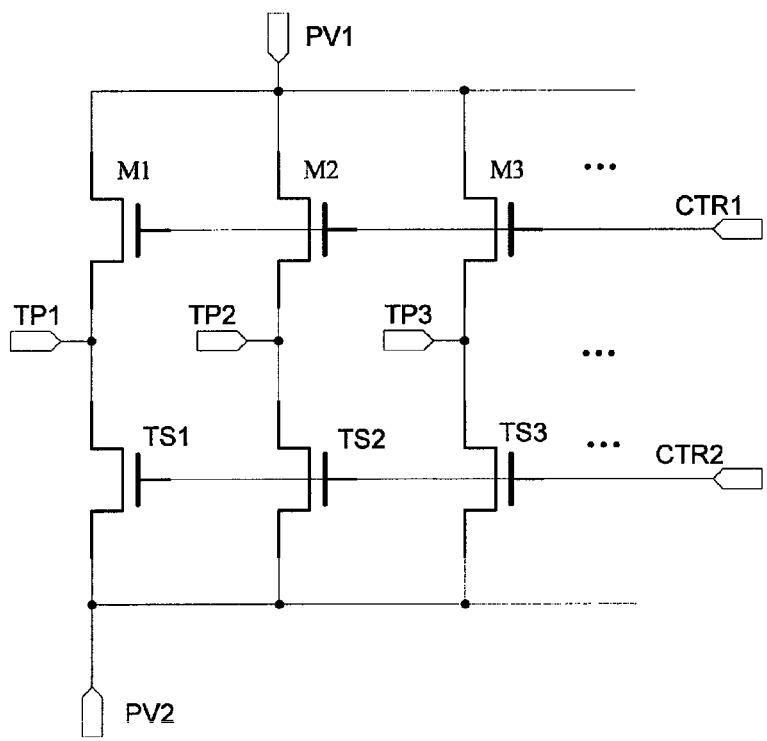
FIG. 6 is a view illustrating a connection structure corresponding to the circuit for testing transistor(s) shown in FIG. 5 according to an embodiment of the present disclosure.

By taking a case where a switching transistor functions as the selection switch as an example, an operational principle of the circuit for testing transistor(s) according to the present embodiment will be described in detail below. As illustrated in FIG. 6, the selection switch unit comprises a plurality of switching transistors TS1, TS2, TS3, . . . ; by taking an NMOS switching transistor as an example, drains of the respective switching transistors are connected to the corresponding test terminals, respectively, gates of the respective switching transistors are connected to the second control signal terminal CTR2, and sources of the respective switching transistors are connected to the second power supply voltage terminal PV2.

When the bias voltages are applied to a plurality of transistors to be tested simultaneously, the first power supply voltage terminal PV1 is connected with a ground level (0V), the second power supply voltage terminal PV2 can be floated or connected with a high level, which can be set depending on the test requirements. The selection switch unit is turned on, and in particular, a high level signal is connected to the second control signal terminal CTR2 so that the respective switching transistors are all turned on, the first control signal Vg is connected to the first control signal terminal CTR1 and can be set depending on the test requirements. For example, if a positive bias is required to be tested, the Vg>0, otherwise, if a negative bias is required to be tested, the Vg<0; at this time, all of the test terminals are floated, that is, no test voltage is inputted to the test terminals.

Of course, when the bias voltage is applied to the transistor to be tested, the levels connected with the first power supply voltage terminal PV1 and the second power supply voltage terminal PV2 can be exchanged while other connection relationships of the signals can be kept unchanged. Because the levels connected to the first power supply voltage terminal PV1 and the second power supply voltage terminal PV2 are different, voltage-division effect of the transistors, that is, the voltage-division effect of the transistor to be tested and the respective switching transistor can be considered when the bias voltage characteristic is tested.

When the current characteristics of the corresponding transistors are test respectively, the first power supply voltage terminal PV1 is connected to the high level and can also be varied depending on the requirements, the second power supply voltage terminal PV2 can be floated, be connected to the high level or to the ground level; the selection switch unit is turned off, and in particular, a low level signal is connected to the second control signal terminal CTR2 such that the respective switching transistors are all turned off; the first control signal Vg is connected to the first control signal terminal CTR1 and can be varied depending on the test requirements; the test voltage (for example, a ground level) is connected to the test terminal to which the corresponding transistor whose current characteristic is required to be test is connected, and the current of this transistor is detected by the probe, while the test terminals to which other transistors are connected respectively are floated. Optionally, the level connected to the second power supply voltage terminal PV2 are same as the test voltage connected to the test terminal, in order to reduce an influence of a leakage current.

Of course, when the current characteristics of the corresponding transistors are tested respectively, the first power supply voltage terminal PV1 can also be connected to the ground level, and at this time, the test voltage (for example, the high level) is connected to the test terminal to which the corresponding transistor whose current characteristic is required to be test is connected and can also be varied depending on the test requirements, and then the current of the transistor being tested is tested and recorded.

In the above description, the circuit for testing transistor(s) and its operational principle according to the embodiment of the present disclosure are explained in detail by taking an NMOS transistor as an example. In fact, the circuit for testing transistor(s) according to the embodiment of the present disclosure can be implemented by replacing the NMOS transistors with PMOS transistors. For example, FIG. 7 illustrates a circuit for testing transistor(s) implemented with the PMOS transistors according to an embodiment of the present disclosure, and its operational principle is similar to that of the circuit for testing transistor(s) implemented with the NMOS transistors, except that turning-on levels and turning-off levels of the respective transistors are opposite. The detailed operational principle would not be repeated herein.

Furthermore, although the switching transistors and the transistor to be tested are illustrated as being of the same type in the embodiment of the present disclosure, as shown in FIGS. 6 and 7, for example, all are the NMOS transistors or the PMOS transistors, actually, the types of the switching transistors and the transistor to be tested can also be different according to the requirements.

According to another embodiment of the present disclosure, there is proposed a method for testing transistors, wherein the NMOS transistor is taken as the transistor to be tested, as illustrated in FIG. 8; wherein, the drains of the respective transistors are connected to the first power supply voltage terminal PV1, the gates of the respective transistors are connected to the first control signal terminal CTR1, and the sources of the respective transistors are connected to the corresponding test terminals TPs, respectively; the method comprises: applying the first voltage V1 to the first power supply voltage terminal PV1, and applying the first control signal Vg to the first control signal terminal CTR1.

According to an embodiment of the present disclosure, when the bias voltage characteristics of the transistors are tested simultaneously, the above method can further comprise: supplying the first voltage to the drains of the respective transistors via the first power supply voltage terminal PV1; supplying the control signal to the gates of the respective transistors via the first control signal terminal CTR1; and setting the respective test terminals to be in the floating state; wherein the level amplitudes of the first voltage and the control signal can be changed depending on the requirements, in order to test the bias voltage state of the transistors under the different drain and/or gate levels in a case in which their sources are floated.

Particularly, as described above, when bias voltage characteristics of the plurality of transistors are tested simultaneously, the test terminals to which the transistors to be tested are connected are floated. The first voltage V1 can be at a high level, and can also be varied depending on test requirements. The first control signal Vg can be at a high level, and can also be varied depending on the test requirements. Because the source of the transistor to be tested is floated, a bias voltage state of the transistor in this case can be acquired.

According to an embodiment of the present disclosure, when the current characteristics of the transistors are tested respectively, the above method can further comprise: supplying the first voltage to the drains of the respective transistors via the first power supply voltage terminal PV1; supplying the first control signal to the gates of the respective transistors via the first control signal terminal CTR1 to turn on the transistor to be tested; and supplying the test voltage to the corresponding test terminal to which the transistor to be tested is connected while setting the test terminals to which the other transistors are connected to be in the floating state; wherein the level amplitudes of the first voltage, the test voltage and/or the control signal are varied depending on the requirements, the current flowing through the transistor to be tested is tested, so that the relationship between the current of the transistor to be tested and voltages of the corresponding drain, source and/or gate is acquired, and thus the current characteristics is acquired.

According to an embodiment of the present disclosure, when the current characteristics of the transistors are tested respectively, the test terminal (for example, TP3) to which the transistor to be tested (for example, the transistor M3) is connected is supplied with the ground level, and the test terminals to which the other transistors are connected are floated. The first voltage V1 is at the high level, and can also be varied depending on test requirements. The first control signal Vg is at the high level to turn on the transistor to be test, and can also be varied depending on the test requirements. The current flowing through the transistor to be tested is detected by the probe, so that relationship between the current of the transistor to be tested and voltages of the corresponding drain, source and/or gate is acquired, thus the current characteristics is acquired.

Of course, when the current characteristic of the transistor is tested, the test terminal corresponding to the transistor to be tested can also be connected to the high level, and the first voltage is at the ground level. The first control signal Vg is at the high level in order to turn on the transistor to be tested and can also be varied depending on the test requirements. The current flowing through the transistor to be tested is detected by the probe, so that the relationship between the current of the transistor to be tested and the voltages of the corresponding drain, source and/or gate is acquired, and thus the current characteristics is acquired.

As described above, according to the embodiments of the present disclosure, by controlling the set of transistors including the plurality of transistors to be tested, the simultaneous testing of the bias voltage characteristics for the plurality of transistors can be achieved, and current characteristics of the corresponding transistors can be further tested respectively, which avoids testing the bias voltage characteristics of the plurality of transistors one by one, so that a waiting time is reduced and a testing efficiency is improved.

According to an embodiment of the present disclosure, there is further proposed a method for testing transistors. Particularly, by taking the NMOS transistor as an example, as illustrated in FIG. 9, the method comprises: connecting the drains of the respective transistors to the first power supply voltage terminal, connecting the gates of the respective transistors to the first control signal terminal, and connecting the sources of the respective transistors to the corresponding test terminals, respectively; connecting the respective test terminals to the second power supply voltage terminal via the selection switch unit; wherein the selection switch unit comprises the plurality of selection switches; wherein the first terminal of the respective selection switches are connected to the second power supply voltage terminal; the control terminals of the respective selection switches are connected to the second control signal terminal; and the second terminal of the respective selection switches are connected to the corresponding test terminals; wherein the first voltage V1 is applied to the first power supply voltage terminal PV1, the first control signal Vg is applied to the first control signal terminal CTR1, the test terminal to which the transistor to be tested is connected is supplied with the test voltage or is floated; the second control signal is applied to the second control signal terminal, and the second power supply voltage terminal is supplied with the second voltage or is floated.

Optionally, the above respective selection switches are the switching transistors, wherein the first terminals of the respective selection switches are the sources of the switching transistors, the second terminals of the selection switches are the drains of the switching transistors, and the control terminals of the selection switches are the gates of the switching transistors.

Since the source and the drain of the switching transistor utilized herein are symmetrical, the source and the drain can be exchanged. In the embodiments of the present disclosure, in order to distinguish two electrodes except for the gate of the transistor, one electrode therein is referred to as the source while the other electrode is referred to as the drain. If the source is selected as a signal inputting terminal, the drain would function as a signal outputting terminal, and vice versa.

According to an embodiment of the present disclosure, when the bias voltage characteristics of the transistors are tested simultaneously, the above method can further comprise: supplying the first voltage to the drains of the respective transistors via the first power supply voltage terminal, supplying the first control signal to the gates of the respective transistors via the first control signal terminal and varying the first control signal depending on the test requirements, and setting the respective test terminals to be the floating state, that is, input no test voltage to the test terminals; supplying the second control signal to the gates of the respective switching transistors via the second control signal terminal so as to turn on the respective switching transistors, so that the sources of the respective transistors are connected to the second power supply voltage terminal, supplying the sources of the respective switching transistors with the second voltage via the second power supply voltage terminal or setting the sources of the respective switching transistors in the floating state; and thus, the relationship characteristic between the corresponding current of the transistor to be tested and voltages of its drain, source and/or gate can be acquired when the bias voltage is applied to the transistor to be tested.

Optionally, according to the above testing method, the level of the first control signal applied as the positive bias test is performed on the respective transistors and that applied as the reverse bias test is performed on the respective transistors are opposite.

In particular, as described above, when the bias voltages are applied to the plurality of transistors to be tested simultaneously, the first power supply voltage terminal PV1 is connected with the ground level (0V), the second power supply voltage terminal PV2 can be floated or connected with the high level, which can be set depending on the test requirements. The selection switch unit is turned on, and in particular, the second control signal with the high level is connected to the second control signal terminal CTR2 so that the respective switching transistors are all turned on, the first control signal Vg is connected to the first control signal terminal CTR1 and can be set depending on the test requirements. For example, if the positive bias is required to be tested, the Vg>0, otherwise, if the negative bias is required to be tested, the Vg<0; at this time, all of the test terminals are floated.

Of course, when the bias voltage is applied to the transistor to be tested, the level connected with the first power supply voltage terminal PV1 and that connected with the second power supply voltage terminal PV2 can be exchanged while other connection relationships of the signals can be kept unchanged. Because the levels connected to the first power supply voltage terminal PV1 and the second power supply voltage terminal PV2 are different, voltage-division effects of the transistors, that is, the voltage-division effects of the transistor to be tested and the respective switching transistor should be considered when the bias voltage characteristics are tested.

According to an embodiment of the present disclosure, when the current characteristics of the transistors are tested respectively, the above method can further comprise: supplying the first voltage to the drains of the respective transistors via the first power supply voltage terminal, supplying the first control signal to the gate of the transistor to be tested via the first control signal terminal, supplying the second control signal to the gates of the respective switching transistors via the second control signal terminal so as to turn off all of the switching transistors, such that the respective test terminals are disconnected electrically from the second power supply voltage terminal, supplying the test voltage to the test terminal to which the transistor whose current characteristic is tested is connected, and testing the current characteristic of this transistor while setting other test terminals to be floated.

In particular, when it is required to test the current characteristics of the corresponding transistors respectively, the first power supply voltage terminal PV1 is connected to the high level and can also be varied depending on the requirements, the second power supply voltage terminal PV2 can be floated, connected to the high level or the ground level; the selection switch unit is turned off, and in particular, the second control signal with the low level is connected to the second control signal terminal CTR2 such that the respective selection switches are all turned off; the first control signal Vg is connected to the first control signal terminal CTR1 and can be varied depending on the test requirements; the test voltage (for example, the ground level) is connected to the test terminal to which the corresponding transistor whose current characteristic to be test is connected, and the current of this transistor is detected by the probe, while the test terminals to which other transistors are connected respectively are floated. Optionally, the level connected to the second power supply voltage terminal PV2 are same as the test voltage connected to the test terminal, in order to reduce an influence of a leakage current.

Of course, when the current characteristics of the corresponding transistors are tested respectively, the first power supply voltage terminal PV1 can also be connected to the ground level, and at this time, the test voltage (for example, the high level) is connected to the test terminal to which the corresponding transistor whose current characteristic to be test is connected and can also be varied depending on the test requirements, and then the current of the transistor to be tested is tested and recorded.

As described above, according to the embodiments of the present disclosure, by controlling a set of transistors including a plurality of transistors and a selection switch unit, it can be achieved that the bias voltages are applied to the plurality of transistors to be tested simultaneously, and that then current characteristics of the corresponding transistors are tested respectively after the bias voltages are applied, which avoids applying the bias voltage to the plurality of transistor to be tested one by one, thus reducing the waiting time and improving the testing efficiency.

Above is described the circuit for testing transistor(s) and its testing method proposed in the embodiments of the present disclosure in details. However, as can be understood by those skilled in the art, the specific structures in the testing circuit and the respective steps for the corresponding testing method only intend to illustrate the operational principle of the embodiments of the present disclosure, and shall not be construed as limitations to the present disclosure. One or more parts and/or steps herein can be combined with each other or can be omitted depending on actual demands and an application scenario.

Those skilled can understand that all or part of flows for implementing the method in the above embodiments can be achieved by computer programs instructing the related hardware, wherein the computer programs can be stored in a computer readable storage medium and can comprise the flows of the embodiments of the respective methods described above as being executed. The storage medium can be a magnetic disc, a compact disc, a Read Only Memory (ROM) or a Random Access Memory (RAM) and the like.

The above descriptions only illustrate the specific embodiments of the present invention, and the protection scope of the present invention is not limited to this. Given the teaching as disclosed herein, variations or substitutions, which can easily occur to any skilled pertaining to the art, should be covered by the protection scope of the present invention. Thus, the protection scope of the present invention is defined by the claims.

What is claimed is:

1. A circuit for testing a set of transistors comprising at least two transistors, wherein the circuit comprises:
   a first power supply voltage terminal connected to first electrodes of the respective transistors;
   a first control signal terminal directly connected to control electrodes of the respective transistors;
   a set of test terminals comprising at least two test terminals, wherein the test terminals are connected to second electrodes of the corresponding transistors, respectively; and
   a selection switch unit, wherein the selection switch unit comprises: at least two selection switches;
   first terminals of the respective selection switches are connected to a second power supply voltage terminal;
   control terminals of the respective selection switches are connected to a second control signal terminal; and
   second terminals of the respective selection switches are connected to the corresponding test terminals, respectively;
   wherein when current characteristics of the corresponding transistors are tested respectively,
   the second control signal terminal is configured to supply the respective selection switches with a second control signal so as to turn off the respective selection switches, so that the second electrodes of the respective transistors are disconnected from the second power supply voltage terminal; and
   the test terminal to which the corresponding transistor to be tested is connected is configured to provide a test voltage, while other test terminals are configured to be in the floating state.

2. The circuit of claim 1, wherein the respective selection switches are switching transistors, the control terminal of each of the selection switches is a gate of the switching transistor, the first terminal thereof is one of a source and drain of the switching transistor, and the second terminal thereof is the other of the source and drain of the switching transistor.

3. The circuit of claim 1, wherein when bias voltage characteristics of the respective transistors are tested simultaneously,
   the first power supply terminal is configured to supply the first electrodes of the respective transistors with a first voltage,
   the first control signal terminal is configured to supply the control electrodes of the respective transistors with a first control signal, and
   the respective test terminals are configured to be in a floating state.

4. The circuit of claim 1, wherein when bias voltage characteristics of the respective transistors are tested simultaneously,
   the first power supply terminal is configured to supply the first electrodes of the respective transistors with the first voltage;
   based on test requirements, the second power supply voltage terminal is configured to either supply the first terminal of the respective selection switches with a second voltage or be in a floating state;
   the first control signal terminal is configured to supply the control electrodes of the respective transistors with the first control signal;

the second control signal terminal is configured to supply the respective selection switches with a second control signal so as to turn on the respective selection switches, so that the second electrodes of the respective transistors are connected to the second power supply voltage terminal; and the respective test terminals are configured to be in the floating state.

5. The circuit of claim 4, wherein a level of the first control signal applied as a positive bias test is performed on the respective transistors and that applied as a reverse bias test is performed on the respective transistors are opposite.

6. The circuit of claim 1, wherein when current characteristics of the corresponding transistors are tested respectively, the first power supply voltage terminal is configured to supply the first electrodes of the respective transistors with the first voltage;

based on test requirements, the second power supply voltage terminal is configured to either supply the respective selection switches connected with the second voltage or be in a floating state; and the first control signal terminal is configured to supply the control electrodes of the respective transistors with the first control signal.

7. The circuit of claim 6, wherein a level of the first voltage and that of the second voltage are different, and the first voltage, the test voltage and/or the first control signal are configured to change their level amplitudes with time depending on test requirements.

8. The circuit of claim 6, wherein the level of the second voltage and that of the test voltage are configured to be same.

9. A method for testing a set of transistors comprising at least two transistors, wherein the method comprises:

connecting first electrodes of the respective transistors to a first power supply voltage terminal;

connecting control electrodes of the respective transistors directly to a first control signal terminal;

connecting second electrodes of the corresponding transistors to test terminals, respectively;

connecting the second electrodes of the respective transistors to a second power supply voltage terminal via a selection switch unit; wherein the selection switch unit comprises at least two selection switches;

connecting first terminals of the respective selection switches to the second power supply voltage terminal;

connecting control terminals of the respective selection switches to a second control signal terminal; and connecting second terminals of the respective selection switches to the corresponding test terminals, respectively, wherein a first voltage is supplied to the first electrodes of the respective transistors via the first power supply voltage terminal, and a first control signal is supplied to the control electrodes of the respective transistors via the first control signal terminal;

wherein when current characteristics of the corresponding transistors are tested respectively, the second control signal is supplied to the respective selection switches via the second control signal terminal, in order to turn off the respective selection switches, so that the second electrodes of the respective transistors are disconnected from the second power supply voltage terminal; and a test voltage is supplied to the test terminal to which the corresponding transistor to be tested is connected, while the other test terminals are configured to be in the floating state.

10. The method of claim 9, further comprises:

when bias voltage characteristics of the respective transistors are tested simultaneously, setting the respective test terminals to be in a floating state, and changing levels of the first voltage and/or the first control signal depending on test requirements.

11. The method of claim 9, wherein when current characteristics of the corresponding transistors are tested respectively, changing the levels of the first voltage, the test voltage and/or the first control signal depending on the test requirements.

12. The method of claim 9, wherein, based on test requirements, either a second voltage is supplied to the first terminals of the respective selection switches via the second power supply voltage terminal or the second power supply voltage terminal is in a floating state; and a second control signal is supplied to the respective selection switches via the second control signal terminal, in order to turn on or turn off the corresponding selection switches.

13. The method of claim 12, further comprises, when bias voltage characteristics of the respective transistors are tested simultaneously:

supplying the respective selection switches with the second control signal via the second control signal terminal so as to turn on the respective selection switches, so that the second electrodes of the respective transistors are connected to the second power supply voltage terminal; and setting the respective test terminals to be in the floating state.

14. The method of claim 13, wherein the levels of the first voltage, the first control signal and/or the second voltage are changed depending on the test requirements.

15. The method of claim 14, wherein a level of the first control signal applied as a positive bias test is performed on the respective transistors and that applied as a reverse bias test is performed on the respective transistors are opposite.

16. The method of claim 9, wherein the levels of the first voltage, the test voltage and/or the first control signal are changed depending on the test requirements.

* * * * *